(12) United States Patent
Bolliger

(10) Patent No.: US 7,184,909 B2
(45) Date of Patent: Feb. 27, 2007

(54) METHOD FOR CALIBRATING A BONDHEAD

(75) Inventor: Daniel Bolliger, Lucerne (CH)

(73) Assignee: Unaxis International Trading Ltd., Cham (CH)

( * ) Notice: Subject to any disclaimer, the term of this patent is extended or adjusted under 35 U.S.C. 154(b) by 39 days.

(21) Appl. No.: 11/008,505

(22) Filed: Dec. 8, 2004

(65) Prior Publication Data
US 2005/0132773 A1 Jun. 23, 2005

(30) Foreign Application Priority Data
Dec. 22, 2003 (CH) .................................. 2214/03

(51) Int. Cl.
*G01P 21/00* (2006.01)
(52) U.S. Cl. ....................................................... 702/95
(58) Field of Classification Search ................ 702/94, 702/95, 150–153
See application file for complete search history.

(56) References Cited

U.S. PATENT DOCUMENTS 5,351,872 A   10/1994   Kobayashi
6,185,815 B1   2/2001   Schindler
6,389,688 B1   5/2002   Srivastava et al.
7,066,373 B2 *  6/2006   Behler .......................... 228/103

FOREIGN PATENT DOCUMENTS

EP   1 191 831   *   3/2002
JP   08045970       2/1996

* cited by examiner

*Primary Examiner*—Michael Nghiem
(74) *Attorney, Agent, or Firm*—Thelen Reid Brown Raysman & Steiner LLP; David B. Ritchie

(57) ABSTRACT

The position of the gripper axis of the chip gripper of a bondhead of an apparatus for mounting semiconductor chips is determined with the aid of a stationary arranged photodetector. The chip gripper contains a suction organ with a suction opening that defines the position of the gripper axis. The chip gripper contains a shaft with a longitudinal drill hole to which vacuum can be applied that is illuminated so that light emerges out of the suction opening of the suction organ. The bondhead is moved over edges of the photodetector and co-ordinates that characterise the position of the gripper axis are determined from the output signal of the photodetector and the position signal of the bondhead. If this method is carried out for different rotary positions of the chip gripper, then any offset of the gripper axis relative to the rotational axis of the bondhead can also be determined.

1 Claim, 3 Drawing Sheets

METHOD FOR CALIBRATING A BONDHEAD

PRIORITY CLAIM

The present application claims priority under 35 U.S.C § 119 based upon Swiss Patent Application No. 2214/03 filed on Dec. 22, 2003, the disclosure of which is herein incorporated by reference.

FIELD OF THE INVENTION

The invention concerns a method for calibrating the gripper axis of a bondhead of an apparatus for mounting semiconductor chips onto a substrate.

BACKGROUND OF THE INVENTION

Such apparatus for mounting semiconductor chips is known in the trade as Die Bonder. The apparatus serves to mount the numerous uniform chips of a wafer that are located next to each other on a chip carrier one after the other onto a substrate, eg, a metallic leadframe. The Die Bonder comprises a wafer table on which the chip carrier is located, a transport system for delivering the substrates and a Pick and Place system to remove the semiconductor chips from the chip carrier and to place them onto the substrate. The Pick and Place system comprises a bondhead with a chip gripper that is moved back and forth by a drive system. The chip gripper can be rotated on a vertical axis so that the rotary position of the semiconductor chip can be altered if necessary. The chip gripper contains an exchangeable gripper that is a suction organ to which vacuum can be applied that is known in the trade as a "pick up tool" or "die collet".

Extremely high demands are placed on an apparatus of this type. For the further processing of the mounted chips, they have to be accurately positioned onto the substrate. It is therefore necessary that the position of the rotational axis of the chip gripper and the position of the gripper axis of the chip gripper are known with great accuracy. In the ideal case, the rotational axis and the gripper axis coincide. Today, various methods are applied to determine the position of the rotational axis and the position of the gripper axis of the chip gripper:

a) The chip gripper is equipped with a metallic tip instead of the suction organ. The chip gripper is brought into different rotary positions and in each rotary position an imprint of the metallic tip is produced on a soft metal. From the position of the imprints produced, the eccentricity of the metallic tip is determined in relation to the rotational axis. This method has the disadvantage that the metal tip can have a different centre to that of the suction organ used afterwards in production.
b) The chip gripper is brought into different rotary positions and in each rotary position, an imprint of the suction organ is produced on a Teflon tape. From the position of the imprints produced, the eccentricity of the gripper axis of the suction organ is determined in relation to the rotational axis. A disadvantage with this method is that the imprints are often hardly recognisable so that the evaluation can not be done without the aid of an operator.
c) The suction organ is purposefully contaminated and an imprint is produced on a semiconductor chip that is to be picked. A disadvantage here is that the contamination leaves a residue on the semiconductor chip that can lead to problems with the subsequent wiring of the semiconductor chip by means of a Wire Bonder.

BRIEF DESCRIPTION OF THE INVENTION

The object of the invention is to develop a simple, reliable method for determining the position of the rotational axis and the position of the gripper axis of the chip gripper.

Independent of its outer shape and material properties, the suction organ of the chip gripper contains a hollow shaft to which vacuum can be applied in order to be able to pick up the semiconductor chip. The centre of this hollow shaft is the gripper axis of the chip gripper. A light source, for example a light-emitting diode is attached to the side of the hollow shaft opposite the suction opening. The light beam emerging from the suction opening produces a light spot on the platform of the Die Bonder. In production, the chip gripper moves over a stationary arranged photodetector. When the chip gripper has grasped a semiconductor chip then no light emerges from the suction opening and therefore no light spot travels over the photodetector. When however the chip gripper has not grasped a semiconductor chip then light emerges from the suction opening and a light spot travels over the photodetector that creates a short electrical current impulse in the photodetector. The signal at the output of the photodetector therefore contains the information as to whether or not the chip gripper has picked a semiconductor chip. The invention now suggests determining the position of the gripper axis of the chip gripper with the aid of this stationary arranged photodetector. Furthermore, the invention suggests determining the position of the gripper axis of the chip gripper in different rotary positions and from this to calculate the rotational axis of the chip gripper and the position of the gripper axis in relation to the rotational axis. In accordance with the invention therefore, the chip gripper is brought into at least three rotary positions. In each rotary position, the chip gripper is moved over the photodetector in two orthogonal directions and, from the signal delivered by the photodetector and the position signal of the bondhead, the two co-ordinates are determined that are occupied by the bondhead when the centre of the light spot is located above the centre of the photodetector. Afterwards, the rotational axis of the chip gripper and the offset between the rotational axis and the gripper axis are calculated from the at least three pairs of co-ordinates.

In another aspect of the invention, a method for calibrating a gripper axis of a chip gripper of a bondhead of an apparatus for mounting semiconductor chips, whereby the chip gripper has a shaft with a longitudinal drill hole to which vacuum can be applied and a suction organ with a suction opening, comprises the following steps:

a) Illuminating the longitudinal drill hole of the shaft of the chip gripper so that a light beam emerges from the suction opening of the suction organ,
b) Moving the bondhead along a first travel path over a first edge of a light-sensitive area of a stationary arranged photodetector and determining a first co-ordinate $x_a$ from an output signal of the photodetector and a first position signal of the bondhead and moving the bondhead along a second travel path over a second edge opposite the first edge of the light-sensitive area of the photodetector and determining a second co-ordinate $x_b$ from the output signal of the photodetector and the first position signal of the bondhead and calculating a co-ordinate $x_1$ as $$x_1 = \frac{x_a + x_b}{2},$$

c) Moving the bondhead along a third travel path over a third edge of the light-sensitive area of the photodetector and determining a first co-ordinate $y_a$ from the output signal of the photodetector and a second position signal of the bondhead and moving the bondhead along a fourth travel path over a fourth edge opposite the third edge of the light-sensitive area of the photodetector and determining a second co-ordinate $y_b$ from the output signal of the photodetector and the second position signal of the bondhead and calculating a co-ordinate $y_1$ as $$y_1 = \frac{y_a + y_b}{2},$$

whereby the co-ordinates $(x_1, y_1)$ characterise the position of the gripper axis.

In yet another aspect of the invention, a method for calibrating a gripper axis and a rotational axis of a chip gripper of a bondhead of an apparatus for mounting semiconductor chips, whereby the chip gripper has a shaft with a longitudinal drill hole to which vacuum can be applied and a suction organ with a suction opening and whereby the chip gripper can be rotated on the rotational axis, comprises the following steps:

a) Illuminating the longitudinal drill hole of the shaft of the chip gripper so that a light beam emerges from the suction opening of the suction organ, and b) Determining co-ordinates $(x_m, y_m)$ for a number n of different rotary positions of the chip gripper, whereby the index m assumes the values 1 to n, by:

i) Moving the bondhead along a first travel path over a first edge of a light-sensitive area of a stationary arranged photodetector and determining a first co-ordinate $x_a$ from an output signal of the photodetector and a first position signal of the bondhead and moving the bondhead along a second travel path over a second edge opposite the first edge of the light-sensitive area of the photodetector and determining a second co-ordinate $x_b$ from the output signal of the photodetector and the first position signal of the bondhead and calculating a co-ordinate $x_m$ as $$x_m = \frac{x_a + x_b}{2},$$

and ii) Moving the bondhead along a third travel path over a third edge of the light-sensitive area of the photodetector and determining a first co-ordinate $y_a$ from the output signal of the photodetector and a second position signal of the bondhead and moving the bondhead along a fourth travel path over a fourth edge opposite the third edge of the light-sensitive area of the photodetector and determining a second co-ordinate $y_b$ from the output signal of the photodetector and the second position signal of the bondhead and calculating a co-ordinate $y_m$ as $$y_m = \frac{y_a + y_b}{2};$$

and c) Determining a centre $(x_c, y_c)$ and a radius of a circle by means of a mathematical fit so that the circle approximates to the co-ordinates $(x_m, y_m)$ determined for the n rotary positions of the chip gripper, whereby the centre of the circle characterises the position of the rotational axis, and determining a vector that characterises the position of the gripper axis relative to the position of the rotational axis.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

DETAILED DESCRIPTION OF THE INVENTION

Figure 1:
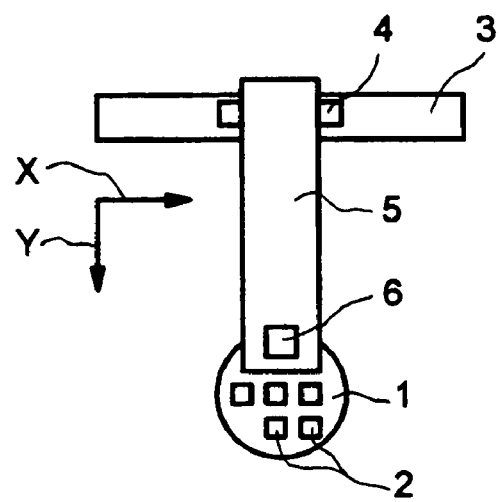
FIG. 1 shows an apparatus for mounting semiconductor chips.

FIG. 1 shows schematically a plan view of an apparatus for mounting semiconductor chips, a so-called Die Bonder. The Die Bonder comprises a wafer table 1 on which the semiconductor chips 2 to be mounted are presented, a platform 3 on which the substrate 4 to be equipped is presented by a not presented transport device, and a Pick and Place system 5 that removes the semiconductor chips 2 from the wafer table 1 and places them onto the substrate 4. The Pick and Place system 5 comprises a bondhead 6 with an exchangeable chip gripper 7 (FIG. 2) and a drive system for moving the bondhead 6 in three orthogonal directions x, y and z. The z direction runs vertically to the plane of projection. Such a Pick and Place system 5 is described for example in U.S. Pat. No. 6,185,815.

Figure 2:
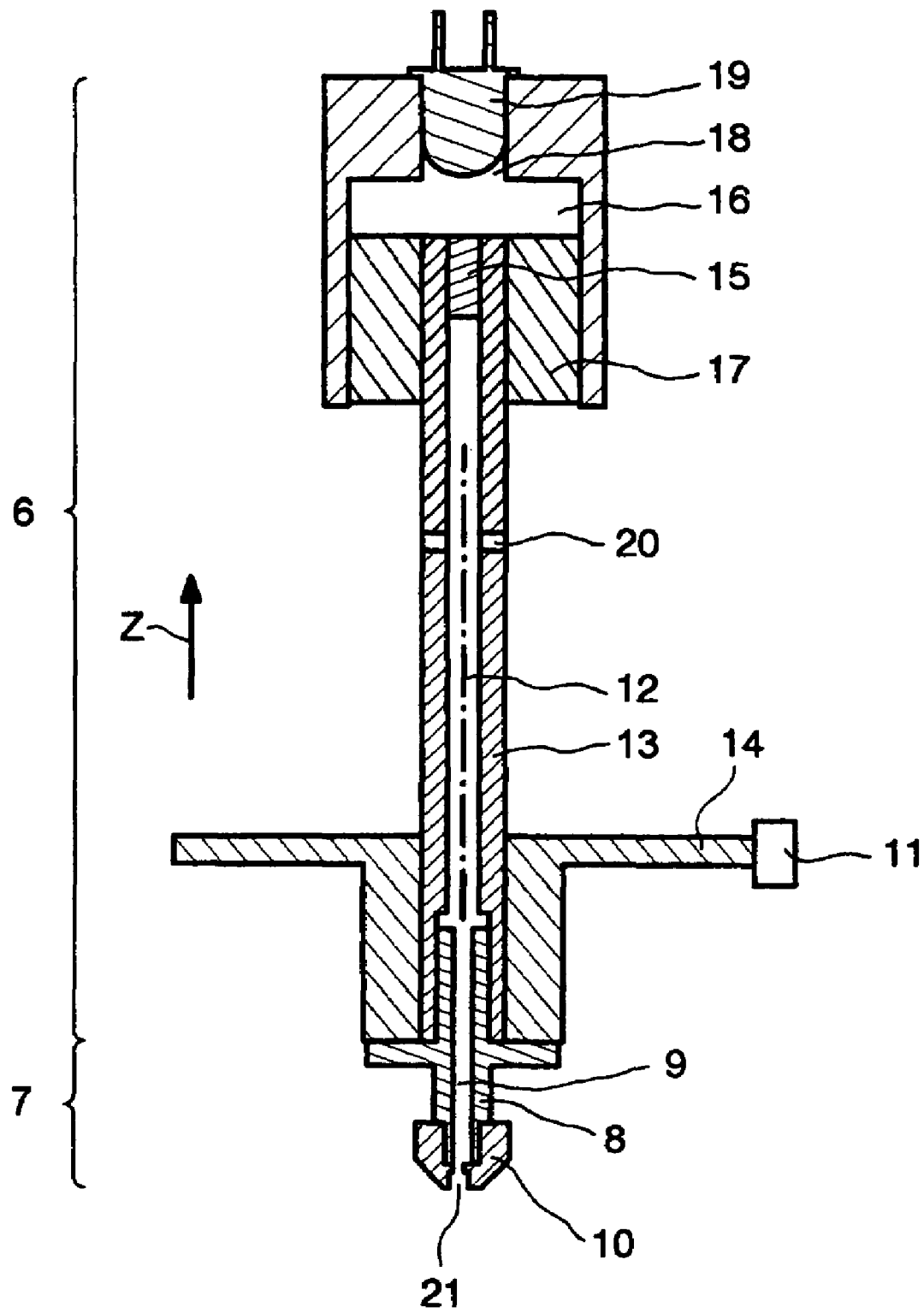
FIG. 2 shows a bondhead with a chip gripper and a photodetector.

FIG. 2 shows a side view of a cross-section of the bondhead 6 with the chip gripper 7. The chip gripper 7 contains a shaft 8 with a longitudinal drill hole 9 to which vacuum can be applied. The lower end of the chip gripper 7 is formed as a suction organ or is equipped with a suction organ 10 that can be clipped onto the shaft 8 into which the longitudinal drill hole 9 of the shaft 8 opens out. The shaft 8 of the chip gripper 7 is detachably mounted, for example via a magnetic coupling, on a hollow shaft 13 of the bondhead 6 that can be rotated on a rotational axis 12 by means of a drive 11. A toothed wheel 14 is mounted on the hollow shaft 13 that is driven by the drive 11. The end of the hollow shaft 13 opposite the suction organ 10 is closed with a glass body 15 and can be rotated in a piston 17 bearing in a pressure chamber 16. The pressure chamber 16 has a drill hole 18 in the wall opposite the end of the hollow shaft 13 in which a light-emitting diode 19 is inserted. The hollow shaft 13 of the bondhead 6 has a vacuum connection 20 for the lateral supply of vacuum. The hollow shaft 13 with the chip gripper 7 is deflectable in z direction in relation to the bondhead 6.

The function of the light-emitting diode 19 is to illuminate the inside of the hollow shaft 13 so that a light beam gets to the outside through the suction opening 21 of the suction organ 10. In the example, the light emitted by the light-emitting diode 19 passes through the pressure chamber 16, the glass body 15, the hollow shaft 13 of the bondhead 6 and the longitudinal drill hole 9 of the shaft 8 of the chip gripper 7 and gets to the outside through the suction opening 21 of the suction organ 10. However, the light-emitting diode 19 could also replace the glass body 15 and be inserted directly into the hollow shaft 13.

The drive system of the Pick and Place system 5 (FIG. 1) is designed so that it can move the bondhead 6 in y direction and x direction as well as raising and lowering it in z direction. The x, y and z co-ordinates of the bondhead 6 are acquired via suitable, known measuring devices and regulated by a controller. The actual x, y and z co-ordinates therefore represent three position signals of the bondhead 6.

Figure 3:
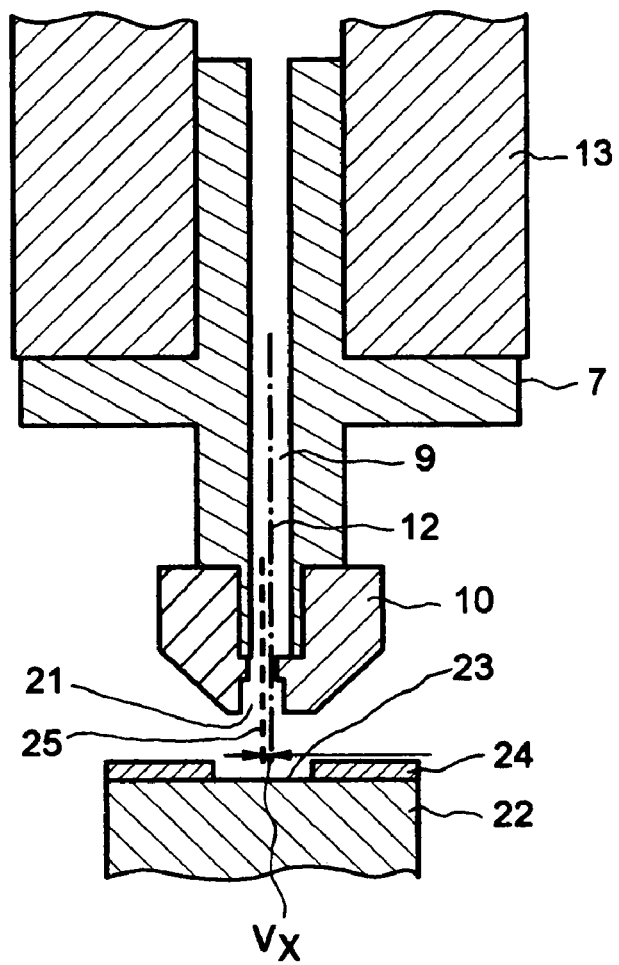
FIGS. 3 and 4 show a side view and a plan view of the chip gripper and its gripper axis and its rotational axis and the photodetector.

FIG. 3 shows the chip gripper 7 that is equipped with an attachable suction organ 10 made of rubber, a so-called "rubber tool", as well as a photodetector 22 that is located in the movement path of the bondhead 6. The photodetector 22 has a light-sensitive area 23 the dimensions of which in the example are defined by means of a plate 24 with a square opening. The centre of the suction opening 21 of the suction organ 10 determines at which point on its surface the semiconductor chip 2 (FIG. 1) is picked. In other words, the centre of the suction opening 21 of the suction organ 10 defines a gripper axis 25 of the chip gripper 7. When the drive 11 (FIG. 2) turns the toothed wheel 14 of the bondhead 6 that is secured to the hollow shaft 13, then the chip gripper 7 turns on the rotational axis 12. In the example presented, the gripper axis 25 and the rotational axis 12 are offset by a vector v. The component of the vector v that falls in the plane of projection is designated $v_x$. For reasons of illustrative clarity, the rotational axis 12 is presented more strongly offset as is to be expected in practice. For manufacturing reasons, the deviation of the gripper axis 25 from the rotational axis 12 characterised by the vector v can achieve significant values that exceed the required tolerance values. In order that the semiconductor chips 2 (FIG. 1) can nevertheless be placed with the required positional accuracy onto the substrate 4 (FIG. 1), the position of the rotational axis 12 and the vector v must be known.

Figure 4:
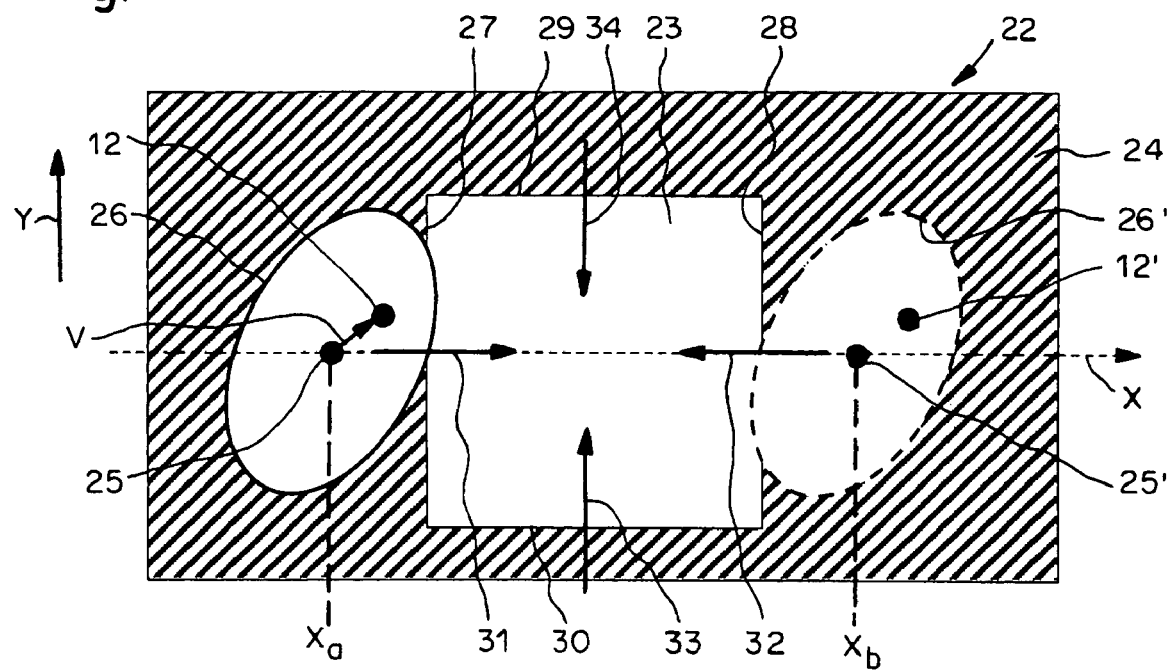

FIG. 4 shows a plan view of the photodetector 22 as well as the position of the rotational axis 12 and the gripper axis 25 and the vector v in a predetermined rotary position of the chip gripper 7 that is assigned to the angle of rotation θ=0°. Also presented is the light spot 26 produced on the plate 24 by the light emerging from the suction opening (FIG. 3). The light spot 26, the gripper axis 25 and the rotational axis 12 are presented twice, namely in a first position and in a second position of the bondhead 6 that are described in more detail below. In the example, the shape of the suction opening 21 is elliptical. Therefore, the shape of the light spot 26 is also elliptical. By definition, the gripper axis 25 is located in the centre of the ellipse defined by its two main axes. The four edges 27 to 30 of the light-sensitive surface 23 of the photodetector 22 each run parallel to the x or y direction of the Pick and Place system 5, i.e., to the movement directions of the bondhead 6.

Determining the position of the rotational axis 12 and the vector v is done according to the following steps:

The bondhead 6 is brought into a position in which the suction opening 21 of the suction organ 10 is located as seen in x direction laterally adjacent to the photodetector 22 and at a specific distance Δz above the photodetector 22 so that the light spot 26 does not fall on the light-sensitive area 23 of the photodetector 22. The light-sensitive area 23 is bordered by the four edges 27 to 30. The distance Δz amounts preferably to some 10 micrometers.

The bondhead 6 moves in x direction from one side to the opposite side of the photodetector 22. In doing so, the light spot 26 travels over the photodetector 22. At first the photodetector 22 is not illuminated and its output signal is at a certain level P. As soon as the light spot 26 reaches the edge 27 of the light-sensitive area 23 of the photodetector 22, the output signal increases, reaches a maximum, reduces and again reaches the level P once the light spot 26 has passed the opposite edge 28 of the light-sensitive area 23 of the photodetector 22. During this process, two x co-ordinates $x_a$ and $x_b$ are determined from the first position signal of the bondhead 6. The co-ordinate $x_a$ corresponds to the x co-ordinate occupied by the bondhead 6 at the time at which the output signal of the photodetector 22 exceeds a predetermined level P+ΔP, i.e., at which the light spot 26 reached the first edge 27 of the photodetector 22 and a small portion of the light spot 26 falls on the photodetector 22. The light spot 26 on the left-hand side in FIG. 4 corresponds to this position. The second co-ordinate $x_b$ corresponds to the x co-ordinate occupied by the bondhead 6 at the time at which the output signal of the photodetector 22 is again lower than the predetermined level P+ΔP, i.e., at which the light spot 26 has almost passed over the second edge 28 of the photodetector 22 and only a small portion of the light spot 26 still falls on the light-sensitive area 23 of the photodetector 22. This position corresponds to the light spot 26' on the right-hand side in FIG. 4.

The bondhead 6 is brought into a position in which the suction opening 21 of the suction organ 10 seen in y direction is laterally adjacent to the photodetector 22 so that the light spot 26 does not illuminate the light-sensitive area 23.

The bondhead 6 moves in y direction from one side to the other side of the photodetector 22. In doing so, the light spot 26 travels in y direction over the photodetector 22. During this process, two y co-ordinates $y_a$ and $y_b$ are determined from the second position signal of the bondhead 6. The first co-ordinate $y_a$ corresponds to the y co-ordinate occupied by the bondhead 6 at the time at which the output signal of the photodetector 22 exceeds the level P+ΔP, i.e., at which the light spot 26 reaches the third edge 29 of the photodetector 22. The second co-ordinate $y_b$ corresponds to the y co-ordinate occupied by the bondhead 6 at the time at which the output signal of the photodetector 22 is again lower than the level P+ΔP, i.e., at which the light spot 26 leaves the fourth edge 30 of the photodetector 22.

Now, co-ordinates $(x_1, y_1)$ are calculated as:

$$x_1 = \frac{x_a + x_b}{2}$$

$$y_1 = \frac{y_a + y_b}{2}$$

The co-ordinates $(x_1, y_1)$ correspond to the co-ordinates that are occupied by the bondhead 6 when the gripper axis 25 of the chip gripper 7 penetrates the centre of the photodetector 22.

This process is suitable as long as the photodetector 22 shows no hysteresis behaviour, i.e., as long as the photodetector 22 switches on and off at the same level. In practice however it can be expected that the photodetector 22 shows a hysteresis effect, i.e., switches on and off at different levels. For this reason, it is advantageous to alter the process to the effect that, on determining the co-ordinates $x_a$ and $x_b$ of edge 27 and also edge 28, the light-sensitive area 23 of the photodetector 22 is passed over from outside to inside or from inside to outside so that therefore both co-ordinates $x_a$ and $x_b$ are determined when the output signal of the photodetector 22 either exceeds the predetermined level $P+\Delta P$ with a travel direction from outside to inside or falls below it with a travel direction from inside to outside. The same is valid for determining the co-ordinates $y_a$ and $y_b$.

With a selected travel direction from outside to inside, the four travel paths presented by the arrows 31, 32, 33 and 34 result with which, for determining the co-ordinates $x_a$, $x_b$, $y_a$ and $y_b$, the bondhead 6 (FIG. 2) passes over in succession the first edge 27, the second edge 28 lying opposite the first edge 27, the third edge 29 and the fourth edge 30 lying opposite the third edge 29 of the light-sensitive area 23 of the photodetector 22 from outside to inside. The order of the travel paths is not important.

The method explained above is preferably carried out for a predetermined number n of different rotary positions of the chip gripper 7 so that any offset between the rotational axis 12 and the gripper axis 25 can be determined. The number of rotary positions amounts to at least n=3. Each rotary position m is assigned to an angle of rotation $\theta_m$. In accordance with the process steps described above, co-ordinates $(x_m, y_m)$ are determined in each rotary position. The co-ordinates $(x_m, y_m)$ therefore describe the co-ordinates occupied by the bondhead 6 when the gripper axis 25 of the chip gripper 7 penetrates the centre of the photodetector 22 in the rotary position characterised by the angle of rotation $\theta_m$.

The co-ordinates $(x_m, y_m)$ lie on a circle 35 (FIG. 5), the centre of which is defined by the position of the rotational axis 12. The radius of the circle 35 corresponds to the amount of the vector v. In order that the radius of the circle can be determined as accurately as possible, the angles of rotation $\theta_m$ are preferably distributed evenly over 360°, i.e., for example with n=3 rotary positions, $\theta_1=0°$, $\theta_2=120°$ and $\theta_3=240°$.

Figure 5:
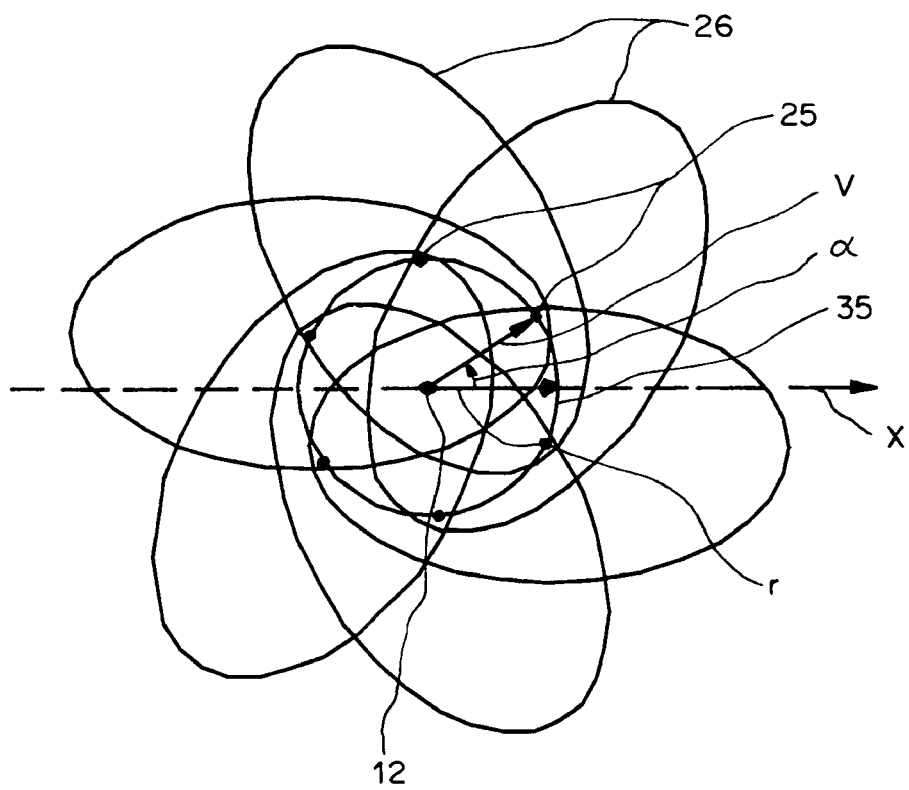
FIG. 5 shows projections on a plane of an elliptical light spot produced by the bondhead in different rotary positions of the chip gripper.

FIG. 5 shows for n=6 different rotary positions with the angles of rotation $\theta_1=0°$, $\theta_2=60°$, $\theta_3=120°$, $\theta_4=180°$, $\theta_5=240°$ and $\theta_3=300°$ the projection of the elliptical light spot 26 on the plane defined by the light-sensitive area 23 (FIG. 3) of the photodetector 22 and the position of the gripper axis 25 assigned to the angles of rotation $\theta_m$ as well as the established rotational axis 12. The six positions of the gripper axis 25 that were defined by the centre of the respective ellipse and their co-ordinates $(x_m, y_m)$ that were determined with i=1 . . . n in accordance with the method described above lie on a circle 35 with the radius r, the centre of which is penetrated by the rotational axis 12 with the co-ordinates $(x_c, y_c)$.

From the n determined co-ordinates $(x_m, y_m)$, whereby the index m has the values 1 to n, the co-ordinates $(x_c, y_c)$ of the centre and the radius r of the circle 35 are therefore determined by means of fitting: The circle 35 is that circle that best approximates to the determined co-ordinates $(x_m, y_m)$ according to accepted mathematical criteria (eg, least squares fit). The vector v, that characterises the position of the gripper axis 25 relative to the position of the rotational axis 12 is preferably defined in relation to the angle of rotation $\theta_1=0°$, i.e., the vector v is given by the angle $\alpha$, described by the gripper axis 25 together with the x axis at angle of rotation $\theta_1=0°$ and the radius r of the circle 35. The angle $\alpha$ can for example be calculated from the co-ordinates $(x_1, y_1)$ and $(x_c, y_c)$.

In order that the semiconductor chips 2 (FIG. 1) can be placed onto the substrate 4 (FIG. 1) at its correct position, the position of the photodetector 22 has to be calibrated in relation to the Pick and Place system 5. Afterwards the bondhead 6 can be controlled so that a possible rotary deviation of the picked semiconductor chip 2 from its ideal rotary orientation can be corrected and the gripper axis 25 of the chip gripper 7 points towards the desired pick point when picking the semiconductor chip 2 or to the desired place point when placing the semiconductor chip 2.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for mounting semiconductor chips on substrates using a bondhead having a chip gripper, whereby the chip gripper has a shaft with a longitudinal drill hole to which vacuum can be applied and a suction organ with a suction opening and whereby the chip gripper can be rotated on a rotational axis, the method comprising calibrating a gripper axis running through the suction opening of the suction organ, the calibrating comprising:

illuminating the longitudinal drill hole of the shaft of the chip gripper so that a light beam emerges from the suction opening of the suction organ, and determining co-ordinates $(x_m, y_m)$ for a number, n, different rotary positions of the chip gripper, whereby an index, m, assumes the values 1 to n, by:

moving the bondhead along a first travel path over a first edge of a light-sensitive area of a stationary arranged photodetector and determining a first co-ordinate $x_a$ from an output signal of the photodetector and a first position signal of the bondhead and moving the bond head along a second travel path over a second edge opposite the first edge of the light-sensitive area of the photodetector and determining a second co-ordinate $x_b$ from the output signal of the photodetector and the first position signal of the bondhead and calculating a co-ordinate $x_m$ as $$x_m = \frac{x_a + x_b}{2},$$

and moving the bondhead along a third travel path over a third edge of the light-sensitive area of the photodetector and determining a first co-ordinate $y_a$ from the output signal of the photodetector and a second position signal of the bondhead and moving the bondhead along a fourth travel path over a fourth edge opposite the third edge of the light-sensitive area of the photodetector and determining a second co-ordinate $y_b$ from the output signal of the photodetector and the second position signal of the bondhead and calculating a co-ordinate $y_m$ as $$y_m = \frac{y_a + y_b}{2};$$

and determining a centre $(x_c, y_c)$ and a radius of a circle by means of a mathematical fit so that the circle approximates to the co-ordinates $(x_m, y_m)$ determined for the n rotary positions of the chip gripper, whereby the centre $(x_c, y_c)$ of the circle characterises the position of the rotational axis, and determining a vector that characterises the position of the gripper axis relative to the position of the rotational axis; and the method further comprising mounting one semiconductor chip after the other on a substrate by moving the bondhead to a first position for picking the semiconductor chip from a wafer table wherein the gripper axis points towards a desired pick point and moving the bondhead to a second position for placing the semiconductor chip on the substrate wherein the gripper axis points towards a desired place point, the first position and the second position depending in part on the vector.

* * * * *